United States Patent
Wahlberg et al.

(10) Patent No.: US 7,059,149 B2
(45) Date of Patent: Jun. 13, 2006

(54) MOBILE SATELLITE LINK TERMINAL

(75) Inventors: Per Wahlberg, Nacka (SE); Markus Selin, Bromma (SE)

(73) Assignee: SWE DISH Satellite Systems, AB, Stockholm (SE)

( * ) Notice: Subject to any disclaimer, the term of this patent is extended or adjusted under 35 U.S.C. 154(b) by 190 days.

(21) Appl. No.: 10/489,351

(22) PCT Filed: Sep. 11, 2002

(86) PCT No.: PCT/SE02/01631

§ 371 (c)(1),
(2), (4) Date: Mar. 12, 2004

(87) PCT Pub. No.: WO03/024179

PCT Pub. Date: Mar. 20, 2003

(65) Prior Publication Data

US 2004/0237570 A1 Dec. 2, 2004

(30) Foreign Application Priority Data

Sep. 13, 2001 (SE) .................................... 0103040

(51) Int. Cl.
*F25D 17/04* (2006.01)
(52) U.S. Cl. .................... 62/407; 62/259.2; 165/104.18
(58) Field of Classification Search .................. 62/407, 62/259.2; 165/104.18; 361/688
See application file for complete search history.

(56) References Cited

U.S. PATENT DOCUMENTS

| | | | | | |
|---|---|---|---|---|---|
| 5,655,375 | A | * | 8/1997 | Ju ................................. | 62/3.6 |
| 5,661,978 | A | * | 9/1997 | Holmes et al. ............... | 62/3.6 |
| 5,704,212 | A | * | 1/1998 | Erler et al. .................... | 62/3.2 |
| 5,934,079 | A | | 8/1999 | Han et al. | |

FOREIGN PATENT DOCUMENTS

| | | |
|---|---|---|
| DE | 3030136 | 3/1982 |
| EP | 0 914 030 | 5/1999 |
| JP | 7-249937 | 9/1995 |
| WO | WO 01/20713 | 3/2001 |

* cited by examiner

*Primary Examiner*—Melvin Jones
(74) *Attorney, Agent, or Firm*—Dickstein Shapiro Morin & Oshinsky LLP

(57) ABSTRACT

A mobile satellite link terminal (1) for transmission of signals such as video signals via satellite (4), including electronic and electric components (13, 14) in a casing (2) that delimit a space for the components in a sealing manner, whereby the casing 82) comprises at least a heat transmitting first wall portion (8) for transmission of generated heat by said components (13, 14) to the environment, wherein a first fan (10) is arranged on the outside of the first wall portion (8) to in operation drive a cooling outer air flow along it, and wherein a second fan (16, 16') is arranged inside the casing to in operation drive an inner air flow b-passing at least some of said components for transmission of heat to the casing (2).

14 Claims, 2 Drawing Sheets

MOBILE SATELLITE LINK TERMINAL

TECHNICAL FIELD

The invention relates to a mobile satellite link terminal according to the preamble of claim 1.

DESCRIPTION OF PRIOR ART

Link terminals for transmission of video signals to satellites are previously known and permit video recordings and live broadcasts may be performed outside studio environment to, e.g. cover events in connection with news broadcasts and the like. Link terminals usually consists of different types of vehicle carried equipment, which may be transported into the field under the assumption that suitable roads are available. In practice, often special vehicles are needed for the transport since the equipment more or less is permanently attached on a carrying vehicle.

A more easily handled equipment launched by the applicant permit a higher degree of mobility, but may even so feel like relatively bulky and heavy if to be used in the filed, since it in practice I relatively vehicle dependent for its use.

OBJECT OF THE INVENTION AND THE MOST IMPORTANT FEATURES

An object with the present invention is to assign a solution at a mobile satellite terminal, as mentioned in the introduction, through which a more compact design and higher mobility may be achieved.

This object is obtained at such a mobile satellite link terminal by the characterising features in the characterising part of claim 1.

In this way an equipment may be provided that has its active components securely displaced in a sealed space, which may be made compact and space saving, and that is arranged in such a way that the emanating heat from the operation of electronic and electric components effectively may be conducted away from the inside of the casing.

In this way, the environment inside the casing may be attended to meet the demands that may set-up for continuous operation of said components, in a temperature sense and as well as limitation of external influences.

Especially heat is provided to be exchanged to the environment by a cooling outer air flow, which is separated from the interior of the casing, while an inner air flow ensures that emanating heat from components transfers to the casing for further transport to the environment. This is done at the same time as the equipment is well protected from the influence of the environment in the form of e.g. rainfall, wind carrying sand and similar damaging material and humidity.

The satellite link terminal is, according to the invention, firstly intended for transmission of video signals, but these may be equal to other possible high power signals, for which generation components are needed that dissipate considerable amounts of heat.

It is preferred that the first wall portion constitute the frame for the casing as well as support for said components, which gives simplified structure and maximised heat conduction from the components to the first wall portion. In reality, the first wall portion in operation is the upper wall of the casing, whereby the largest possibilities for heat dissipation normally exists from this wall portion.

By providing the first wall portion with cooling fins on the outside, the heat exchange with the environment is increased.

Radial displacement of the cooling fins towards a specific position gives efficient air guidance to and from said position, respectively, which is particularly advantageous when arranging a fan at said position. This particularly applies if this fan is arranged with the axis perpendicular to the first wall portion, whereby axially drawn in air and blown out air is distributed respectively collected by assistance of the continuous radial cooling fins.

It is preferred that components with especially high heat generation are placed with thermal contact, if possible, against the first wall portion. When it has to do with e.g. signal amplifier (SSPA) and modem. Placement with thermal contact, and e.g. by supplying a conductive paste, will improve the heat conduction. These components are furthermore preferably centrally arranged in the vicinity of an external fan.

The arrangement of heat-pipes, i.e. heat conductive arrangements that operate with evaporation of a fluid in one position where absorption of heat is desired and condensation of said fluid at a distant situated area, where heat is intended to be emitted may advantageously be arranged at the position of components with especially high heat generation.

The arrangement of one or more internal fans to provide an inner air flow ensures cooling of components that are not suitable to, or may not, be arranged in heat conducting contact with any part of the casing. Here it has to do with e.g. equipment placed on circuit boards, such as e.g. AC-DC converters.

The arrangement of surface enlargements on the inside, such as cooling fins, heat conducting stubs etc. ensures transfer of heat from the circulating inner air to the casing and in particular to the first wall portion.

The mounting of a protective cover on the outside of the first wall portion, and in particular in the area at the border of the cooling fins, will contribute to increased air guidance of circulating outer cooling air along the cooling fins but may in certain extent limit the heat dissipation to the environment.

The casing may possibly be designed to be heat conductive and heat dissipative to the environment in its entirety. In that case it is of current interest to design the whole casing in metal or any other good heat conducting material.

Further advantages are achieved by other aspects of the invention, which is apparent from the following description of preferred embodiments.

BRIEF DESCRIPTION OF DRAWINGS

The invention will now be described in more detail with direction to preferred embodiments and with reference to attached drawings, in which.

DETAILED DESCRIPTION OF PREFERRED EMBODIMENTS

Figure 1:
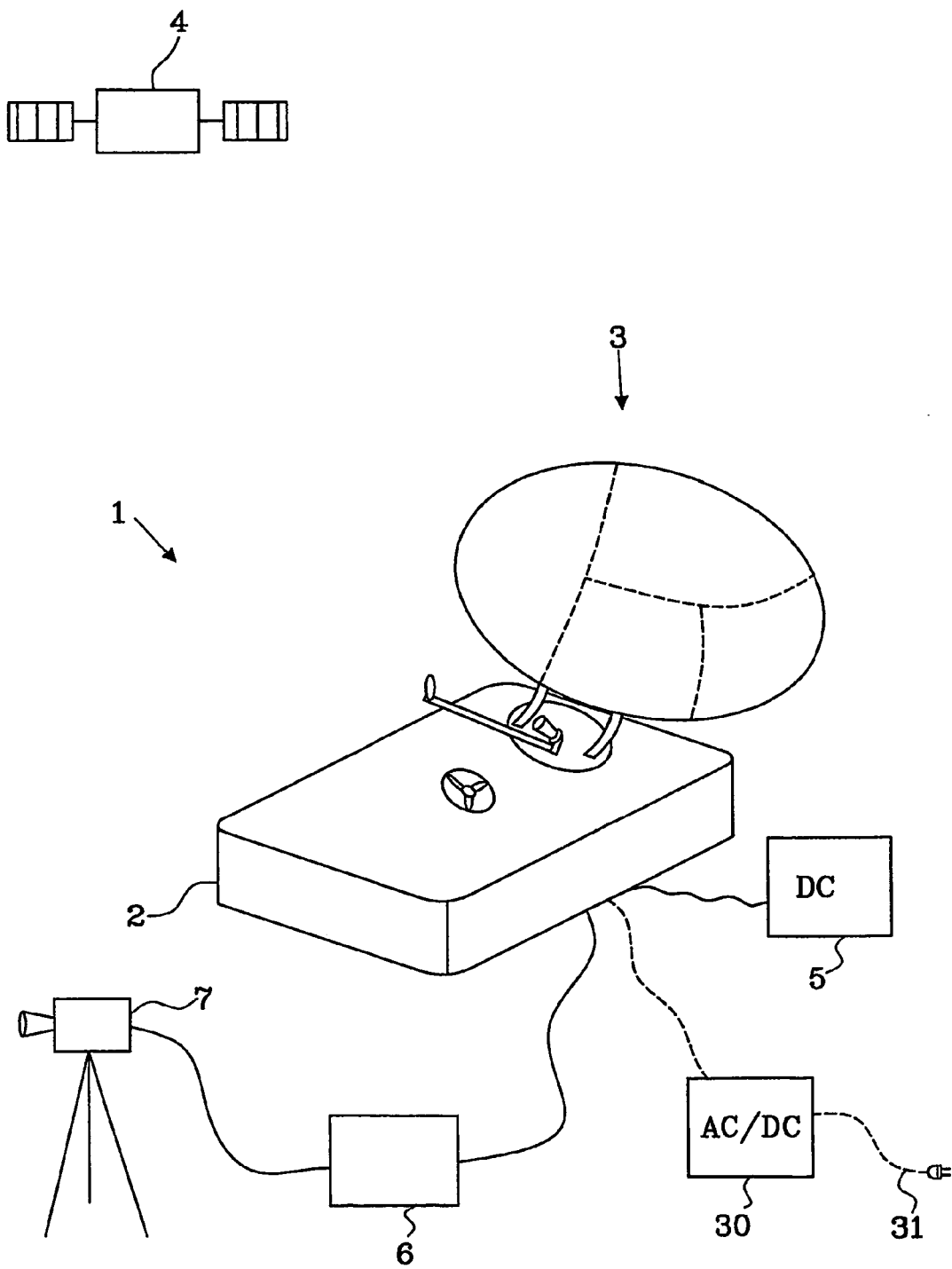
FIG. 1 shows an operational satellite link terminal according to the invention.

The shown satellite link terminal 1 in FIG. 1 comprises a casing 2, which contains electronic and electric components intended to be active in connection with co-operation with a parabolic antenna 3 that is intended to be directed towards a communication satellite 4. The electric and electronic components are powered by a current source 5 that may be a battery pack with suitable voltage. An ordinary household network, a mobile generator or similar may also be used for current supply. A control unit 6 and a video camera 7 are also shown in FIG. 1, which are connected with the satellite link terminal 1.

The invention relates to a highly mobile or portable satellite link terminal, which means that a number of heat generating units have to be confined in a relatively limited space. Hereby it is about placing, inside the casing, in order of power emission: signal amplifier (SSPA), modem, personal computer, signal converter and operating means for controlling the parabolic antenna.

A power unit or AC-GC converter that belong to the terminal may likewise be placed inside the casing but may also, as indicated in FIG. 1, reference numeral 30, be separated from the casing and thereby form an independent unit. 31 indicate a cord for connection to the power network. By this placement, a substantial part of the heat generation occurs outside the casing in connection with operation of the terminal and no cooling is thus necessary. The impact of electrical fields generated by the AC-DC converter on sensitive components in the terminal is also reduced by placing the AC-DC converter outside the casing.

The components are placed as far as possible inside the casing with heat conducting contact towards the casing and the heat is in this way partly distributed in said casing, and the heat energy is partly dissipated to the environment via the outside of the casing. To ensure that the device according to the invention becomes highly mobile or even portable is has to do with containing these components in a space corresponding to a medium size suitcase.

Figure 2:
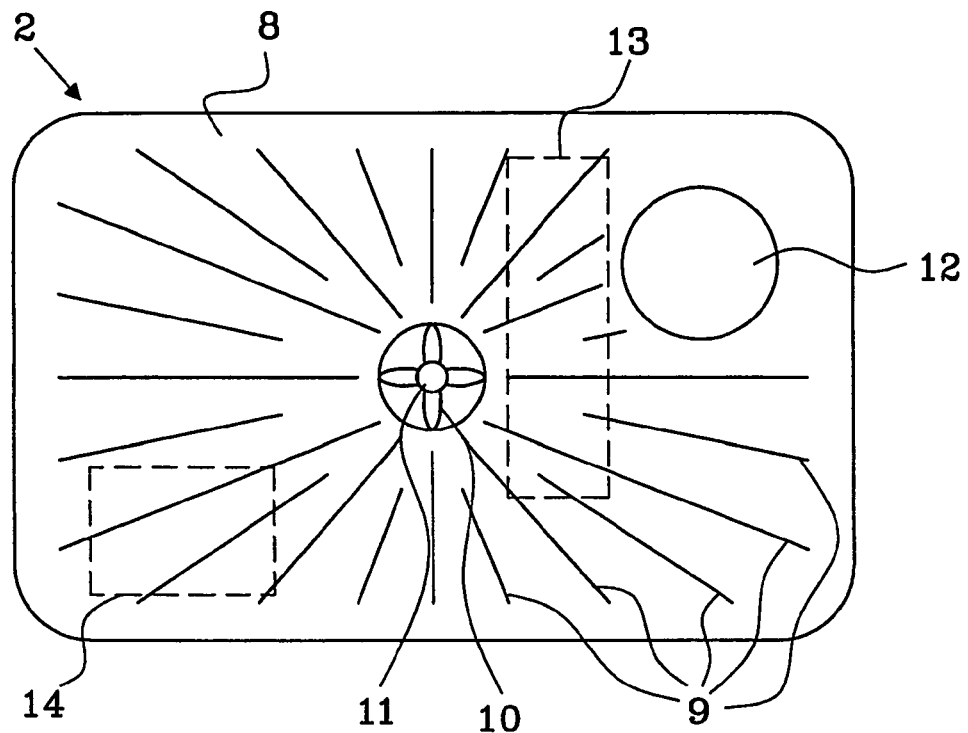
FIG. 2 shows a plane view of a detail of the satellite link terminal in FIG. 1 from above.

The casing 2 is shown in an operation position from above in FIG. 2, but with the parabolic antenna removed. The casing 2 comprises a first wall portion 8 that consists of a base plate for carrying said electric and electronic components, which are contained inside the casing. The base plate thus serves as frame for the device and in particular for the casing and at the same time as the most important heat dissipater. To further enhance the heat conductivity, the first wall portion 8 is provided with outgoing cooling fins substantially perpendicular to the surface of the first wall portion, of which cooling fins a few are indicated with the reference numeral 9, and which are directed towards or starts from a central position of the first wall portion 8.

At this position, a first fan 10 is arranged that in this shown embodiment is arranged to provide a cooling air flow along at least the main part of the length of the radial cooling fins 9. To avoid the need of a connection for moving parts through the first wall portion 8, a fan motor 11 that belong to the fan 10 is mounted on the outside of the first wall portion. Hereby the need for passing the axis of the fan through the material of the first wall portion is avoided, whereby also space inside the casing is saved and the mounting of a further heat generating device is avoided. The feeding to the motor is performed via cables, not shown, that are fed through the wall portion 8 in a sealing manner. It is also possible to have a contact-less drive of the fan 10, wherein in that case the operating means, such as operating circuits, may be mounted inside the casing.

An attachment device for the parabolic antenna is denoted 12, which consists of a rotary plate, and which is operated by a suitable motor (not shown) placed inside the casing via a sealed through-connection. At 13, the placement of a signal amplifier (SSPA) is indicated by dashed lines; which is placed as close as possible to the centre and thereby the fan 10 to obtain the highest possible cooling effect. This SSPA is as mentioned the largest heat generating device within the casing. Furthermore, at 14, a component that in this case as an example is an AC-DC converter is indicated, similarly with dashed lines, which likewise constitutes a considerable heat generating device. Compare hereby with FIG. 1, where the AC-DC converter is arranged outside the casing.

Figure 3:
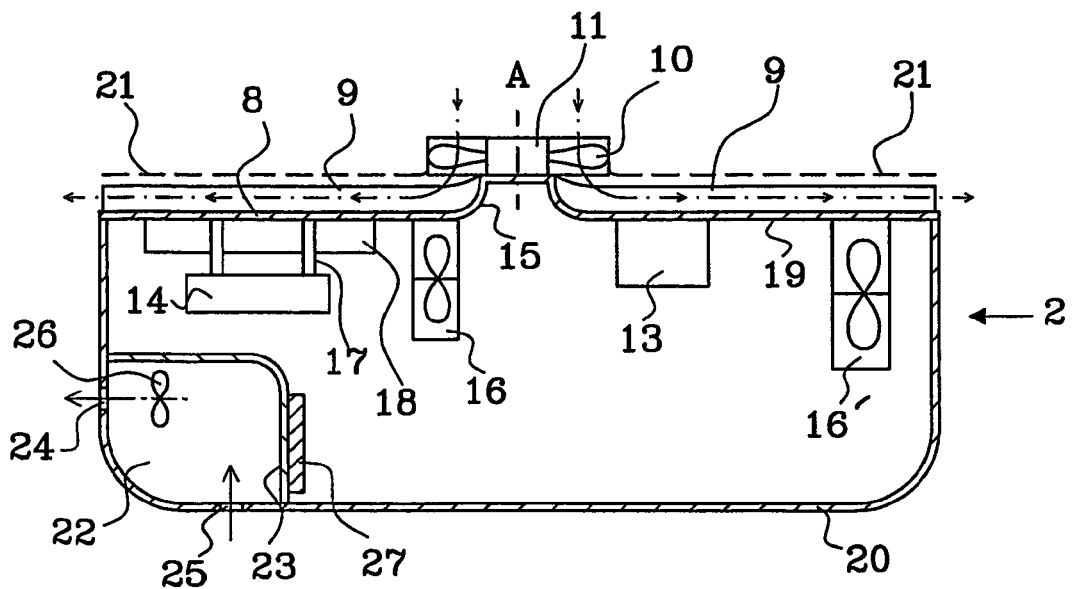
FIG. 3 shows a simplified cross-section of the satellite link terminal.

A cross-section of the structure of the first wall portion 8 is further shown in FIG. 3. The first wall portion 8 shows a construction 15 below the motor 11 of the fan 10, the construction 15 servers to deflect drawn in air flow from the fan 10 along the cooling fins 9. The construction 15 is rounded off for this purpose so that the construction smoothly turns into the main plane of the first wall portion 8.

As is shown by the figure, and which is preferred, the fan operates with an at least partial axial flow. In particular, it has been found suitable to use, as the fan 10, a diagonal type of fan.

Furthermore, the component is shown, in this case the AC-DC converter 14 that is shown as an example of a component, which is not mounted in direct thermal contact with the base plate or the first wall portion 8. Instead, this component 14, which is built up on a circuit board, is mounted on a holder 17 at a certain distance from this base plate 8. In the area of the component 14, the inside of the base plate 8 is provided with a number of cooling fins 18 (or in reality heat absorption fins), whereof one is shown in FIG. 3. The rest of the cooling fins are suitably arranged on the side of the shown cooling fin 18 and all are preferably directed towards a fan 16 to facilitate air flow by-passing these cooling fins 18.

It is preferably provided that not only the cooling fins 18 but also the holder 17 are arranged for permission of best air passage around the component 14. The object with the cooling fins 18 is thus actually to be a heat absorption surface enlargement of the first wall portion 8, so that warm air by-passing these cooling fins 18 is allowed to cool, and the heat is transferred out through the casing to the outside of the first wall portion 8. Previously mentioned SSPA 13 is thus shown as an example of a component that is mounted with thermal contact with the base plate. This thermal contact may be improved e.g. through inserting of a conductive paste in connection with mounting of the component to the base plate.

To further increase the cooling effect, one or several heat-pipes 19 may be inserted, which operates in the above mentioned way to conduct heat to a predetermined place. By using heat-pipes, the possibility to use larger parts of the base plate as effective heat conductor is increased.

An additional fan 16' is arranged inside the casing to further increase the circulation inside the casing.

It may be noted that a number of components and cables etc. that normally are included in the satellite link terminal are omitted for clarity in FIG. 3. The principle for the attachment and arrangement of the components in relation to each other, to the base plate and to the fans is however the same as for the shown components in the figure. An important aspect with cables is that these, for the heat conductive purposes, preferably should be kept away from heat dissipating components and be directed and collected so that they do disturb the inner air circulation as little as possible.

The base plate is preferable manufactured in an aluminium alloy and manufacturing methods that are applicable are e.g. casting to a final shape or machining of a more or less prepared work piece. Other materials and manufacturing methods also lies within the scope of the invention.

There is also a possibility to insulate certain components from the rest of the space inside the casing of e.g. security reasons, since such components should be kept away from large heat generators and also due to the influences of electromagnetic fields generated by certain components.

The second wall portion 20 of the casing is normally manufactured of a plastic material. Insertion of a thermal conductive material in these portions may however result in a desired increase of heat conduction to the surroundings. It should be noted that the bottom part of the casing 2 normally functions as a supporting surface for the satellite link terminal in operation of the device, wherein it is manufactured mechanically strong. Possibly, a protective cover 21 is inserted over the upper side of the cooling fins 9, indicated by dashed lines, which protects the fan and the cooling fins from influences and also protects personnel from injuries at the risk of contact with hot cooling fins. In addition to that, the protective cover 21 provides a guidance of the air flow along the cooling fins 9. The dashed lines schematically shows the air flow through the fan and along the fins 9, but it should be noted that the air flow may be directed differently, for instance, the fan may draw the cooling air in an opposite direction compared to what is shown by the dashed arrows, i.e. the air is drawn in peripherally and blown out centrally. An advantage with a such device is that dirt, leaves etc. does not reach the fan as easy as for an air flow direction according to FIG. 3.

To further increase the cooling effect, an active cold emitting device, such as a PLT element 27, be arranged with a heat collecting/cold emitting surface arranged towards the space for the components inside the casing. The warm side of the cold emitting device may be arranged in such a way that heat dissipation is performed against a heat conductive wall 23, which together with a part of the casing delimit a space 22 in which an air flow is driven through the holes 24, 25 by a fan 26. Also other arrangements of active cold emitting devices may be of interest.

The invention may be modified within the scope of the appended claims. Thus, the heat dissipating external surface of the casing may be differently arranged, even though it has been found that it is advantageous to have the fan centrally placed. Furthermore, some cooling fins may be replaced by air channels, through which a fan drives the cooling air. Internal fan systems may be arranged differently with one or more fans placed differently than what is shown. Surface enlarging elements may be arranged along large parts of the inside of the base plate as well as on other parts of the casing.

The invention has been described in the condition when using the terminal for transferring video signals, in addition to that the terminal may be used for transmitting signals of other types as a complement to the video signals. The terminal should at least be arranged for transmitting these signals but is preferably also arranged for receiving thereof.

The invention claimed is:

1. Mobile satellite link terminal for transmission of signals via satellite, including a controllable satellite antenna, electronic and electric components at least for generation of signals intended for transmission and a casing for carrying the components, wherein:

the casing delimits a space for the components in a sealing manner, the casing comprises at least a heat transmitting first wall portion for transmission of generated heat by said components to the environment, a first fan is arranged on the outside of the first wall portion to in operation drive a cooling outer air flow along it, at least a second fan is arranged inside the casing to in operation drive an inner air flow by-passing at least some of said components for transmission of heat to the casing, at least one of said components is arranged with thermal contact against the first wall portion, and the first wall portion constitutes the frame for the casing and support for said components.

2. Terminal according to claim 1, wherein the first wall portion is provided with cooling fins on the outside displaced in the direction of said outer air flow.

3. Terminal according to claim 2, wherein the cooling fins (9) run substantially radial towards a position on the first wall portion.

4. Terminal according to claim 3, wherein the first fan (10) is arranged at said position.

5. Terminal according to claim 4, wherein the fan has its axis (A) arranged substantially perpendicular to the first wall portion.

6. Terminal according to claim 4, wherein a motor (11) belonging to the first fan (10) is arranged outside the casing.

7. Terminal according to claim 1, wherein an active cooling generator is arranged with a cold emitting part connected to said space for the components.

8. Terminal according to claim 1, wherein the components that are arranged in thermal contact against the first wall portion is a signal amplifier (SSPA) and a modem.

9. Terminal according to claim 7, wherein one or more heat-pipe (s) is/are arranged in the first wall portion between the position of said component (s) and an expected cooler area of the casing.

10. Terminal according to claim 1, wherein the second fan (s) is/are arranged to circulate air inside the casing by-passing heat generating components as well as heat absorption and heat transmission wall areas of the casing.

11. Terminal according to claim 1, wherein at least one of the heat absorption wall areas is provided with surface enlargements on the inside of the casing.

12. Terminal according to claim 1, wherein a protective cover for mounting on the outside of the first wall portion and arranged to direct the air flow along the first wall portion.

13. Terminal according to claim 1, wherein the first wall portion exhibits a sealed through-connection for a movement transferring device for the satellite antenna.

14. Terminal according to claim 1, wherein substantially the casing in its entirety is designed to be heat conductive and heat dissipative to the environment.

* * * * *